United States Patent [19]
Kim et al.

[11] Patent Number: 6,137,163
[45] Date of Patent: *Oct. 24, 2000

[54] SEMICONDUCTOR SUBSTRATE AND STACKABLE SEMICONDUCTOR PACKAGE AND FABRICATION METHOD THEREOF

[75] Inventors: Jo-Han Kim; Jin-Sung Kim, both of Cheongju, Rep. of Korea

[73] Assignee: Hyundai Electronics Industries Co., Ltd., Kyoungki-Do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 09/060,707

[22] Filed: Apr. 16, 1998

[30] Foreign Application Priority Data

Sep. 12, 1997 [KR] Rep. of Korea ...................... 97-47075

[51] Int. Cl.[7] ................................................ H01L 23/02
[52] U.S. Cl. ........................... 257/686; 257/698; 257/723; 438/107; 438/109; 438/612
[58] Field of Search .................................. 257/686, 621, 257/685, 698, 723; 438/106, 107, 109, 614, 615, 612

[56] References Cited

U.S. PATENT DOCUMENTS

| | | |
|---|---|---|
| 5,043,794 | 8/1991 | Tai et al. .................................. 257/686 |
| 5,241,454 | 8/1993 | Ameen et al. ........................... 257/686 |
| 5,241,456 | 8/1993 | Marcinkiewicz et al. ............... 257/686 |
| 5,355,283 | 10/1994 | Marrs et al. . |
| 5,481,133 | 1/1996 | Hsu ......................................... 257/686 |
| 5,798,564 | 8/1998 | Eng et al. ................................ 257/686 |
| 5,835,061 | 11/1998 | Kim ......................................... 257/686 |
| 5,838,060 | 11/1998 | Comer ..................................... 257/686 |
| 5,861,666 | 1/1999 | Bellaar .................................... 257/686 |

*Primary Examiner*—Donald L. Monin, Jr.
*Assistant Examiner*—Mike Dietrich

[57] ABSTRACT

A semiconductor substrate and a stackable semiconductor package and a fabrication method thereof which make it possible to form a highly-integrated semiconductor module within a limited area. The semiconductor substrate includes a non-conductive substrate main body having a plurality of patterned conductive wires formed therein, a cavity formed in an upper center portion of the substrate main body, and a plurality of via holes which perpendicularly pass through edge portions of the substrate main body. A stackable semiconductor package includes the above-described semiconductor substrate, having a semiconductor device positioned in its cavity with a molding compound, the semiconductor device being electrically connected to the conductive wires formed in the semiconductor substrate. Plural stackable semiconductor packages may be stacked such that the via holes are aligned, and a conductive material such as solder can be placed in the via holes to ensure electrical connection. Additionally, conductive external terminals may be positioned on upper and lower surfaces of the substrate main body of the upper and lower stackable semiconductor packages.

2 Claims, 3 Drawing Sheets

SEMICONDUCTOR SUBSTRATE AND STACKABLE SEMICONDUCTOR PACKAGE AND FABRICATION METHOD THEREOF

BACKGROUND OF THE INVENTION

1. Field of the Invention

The present invention relates to a semiconductor substrate and a stackable semiconductor package and a fabrication method thereof, and in particular to an improved ball grid array (BGA) semiconductor package.

2. Description of the Conventional Art

FIG. 1 illustrates the construction of a conventional BGA semiconductor package. As shown therein, there is provided a substrate main body 11. A plurality of patterned conductive wires (not shown) are formed within the substrate main body 11. A semiconductor chip 13 having a plurality of chip pads (not shown) is attached on the upper surface of the substrate main body 11 using an adhesive 15. The chip pads are electrically connected with the conductive wires by a plurality of metal wires 17. A molding portion 18 is provided, where a predetermined portion of the substrate main body 18 is molded to molding portion 18 by an epoxy molding compound for encapsulating the semiconductor chip 13 and the metal wire 17. In addition, a plurality of solder balls 19 are attached on the lower surface of the substrate 11 for connecting with the conductive wires formed within the substrate 11. In the conventional BGA semiconductor package, it is impossible to stack the semiconductor chips due to the structural characteristic. Therefore, it is impossible to form a highly-integrated memory module in a limited area.

SUMMARY OF THE INVENTION

It is an object of the present invention to provide a semiconductor substrate and a stackable semiconductor package and a fabrication method thereof which overcome the aforementioned problem encountered in the conventional art.

It is another object of the present invention to provide an improved semiconductor substrate and a stackable semiconductor package and a fabrication method thereof, which make it possible to form a high-integrated semiconductor module within a limited area.

To achieve the above objects, there is provided a semiconductor substrate that includes a non-conductive substrate main body having a plurality of patterned conductive wires formed therein, a cavity formed in an upper center portion of the substrate main body, and a plurality of via holes that perpendicularly pass through edge portions of the substrate main body.

To achieve the above objects, there is provided a stackable semiconductor package that includes a non-conductive substrate main body having a plurality of patterned conductive wires formed therein, a cavity formed in an upper center portion of the substrate main body, a plurality of via holes that perpendicularly pass through edge portions of the substrate main body, a semiconductor chip attached on a lower surface of the cavity, a plurality of conductive wires for electrically connecting the semiconductor chip and the conductive wires, a plurality of conductive metallic bars filled into each via hole, a plurality of conductive external terminals attached on at least one of, and sometimes both of, upper and lower surfaces of the substrate main body for being electrically connected with the metallic bars, and a molding compound filled within the cavity for molding the semiconductor chip and the wires.

In addition, to achieve the above objects, there is provided a stackable semiconductor package fabrication method which includes preparing a non-conductive substrate main body having a plurality of patterned conductive wires formed therein, forming a cavity having a step portion formed on an upper center portion of the substrate main body, forming a plurality of via holes perpendicularly passing through the substrate main body near the cavity, attaching a semiconductor chip on a lower surface of the cavity, electrically bonding the semiconductor chip and the conductive wires using conductive wires and molding the semiconductor chip and the wires by filling a molding compound into the cavity, preparing stackable semiconductor packages, aligning the via holes formed in the stackable semiconductor packages and stacking the stackable semiconductor packages, filling a conductive metallic material into the thusly aligned via holes, respectively, and attaching conductive external terminals to an upper surface of an uppermost layer of the semiconductor package and a lower surface of a lowermost layer of the semiconductor package for being electrically connected with the conductive metallic material.

Additional advantages, objects and features of the invention will become more apparent from the description which follows. Further scope of applicability of the present invention will become apparent from the detailed description given hereinafter. However, it should be understood that the detailed description and specific examples, while indicating preferred embodiments of the invention, are given by way of example only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The present invention will become more fully understood from the detailed description given hereinbelow and the accompanying drawings which are given by way of illustration only, and thus are not limitative of the present invention, and wherein:

A semiconductor substrate, a stackable semiconductor package fabricated using the same, and a semiconductor module and a fabrication method thereof will now be explained.

Figure 1:
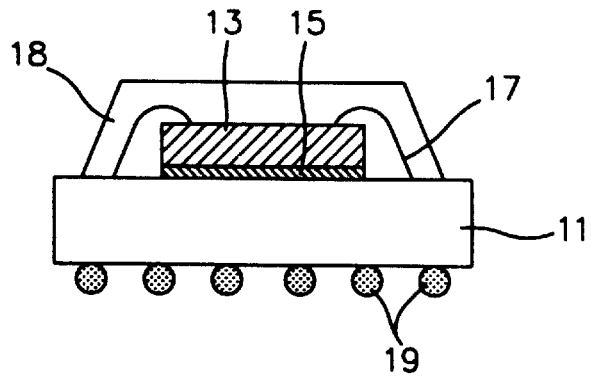
FIG. 1 is a cross-sectional view illustrating a conventional ball grid array semiconductor package.
Figure 2:
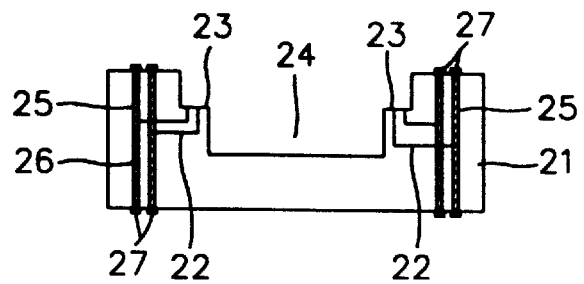
FIG. 2 is a cross-sectional view illustrating a semiconductor substrate according to the present invention.

FIG. 2 is a cross-sectional view illustrating a semiconductor substrate according to the present invention. As shown therein, there is provided a non-conductive substrate main body 21 within which a plurality of patterned conductive wires 22 are encapsulated. A cavity 24 having a step portion 23 is formed on a center portion of the upper surface of the substrate main body 21. A plurality of via holes 25 perpendicularly passing through the substrate main body 21 are formed at both sides of the cavity 24. One end of each of the conductive wires 22 is exposed on the upper surface of the step portion, and the other end of the same is extended into a corresponding via hole 25.

In addition, a conductive metal bar 26 such as a solder bar is filled in the via holes 25, respectively, and outer terminals 27 are attached on the upper and lower surfaces of the substrate main body 21 for being electrically connected with both ends of each of the metal bars 26. The metal bars 26 and the outer terminals 27 may be optionally formed in another embodiment of the present invention.

Figure 3:
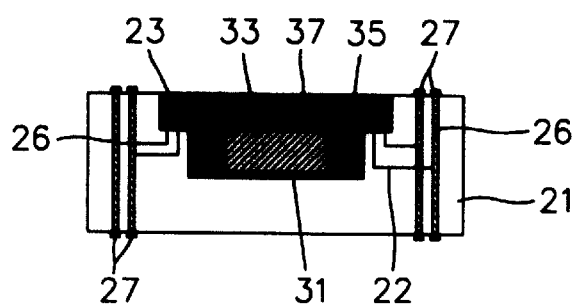
FIG. 3 is a cross-sectional view illustrating a stackable semiconductor package according to the present invention.

FIG. 3 is a cross-sectional view illustrating a stackable semiconductor package according to the present invention. As shown therein, namely, the semiconductor chip is packaged using the semiconductor substrate of FIG. 2. In the embodiment of FIG. 3, the elements which are identical to the embodiment of FIG. 2 are given the identical reference numerals. The description thereof will be omitted.

As shown in FIG. 3, a semiconductor chip 33 is attached on a lower surface of the cavity 24 using an adhesive member 31. A plurality of conductive wires 35 are used to electrically connect the semiconductor chip 33 and the conductive wires 22, and a molding compound 37 is filled within the cavity 24, thereby encapsulating the semiconductor chip 33 and the wires 35.

The method of fabricating a stackable semiconductor package according to the present invention will now be explained with reference to FIGS. 4A through 4D.

Figure 4A:
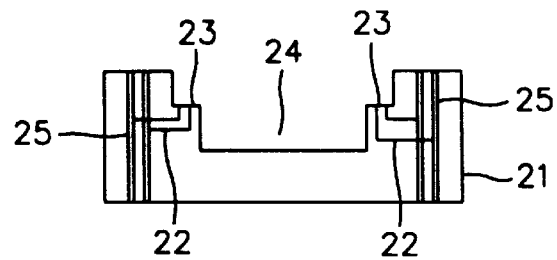
FIGS. 4A through 4D are cross-sectional views illustrating a fabrication method of a stackable semiconductor package according to the present invention.

First, as shown in FIG. 4A, a non-conductive substrate main body 21 having a plurality of patterned conductive wires 22 is provided, and a cavity 24 is formed on the center upper portion of the substrate main body 21 and has a step portion 23. Via holes 25 are formed to perpendicularly pass through the substrate main body 21 near the cavity 24. The conductive wires 22 are patterned such that one end of each of the conductive wires 22 is exposed on the upper surface of the step portion 23, and the other end thereof is exposed within the via holes 25, respectively.

Figure 4B:
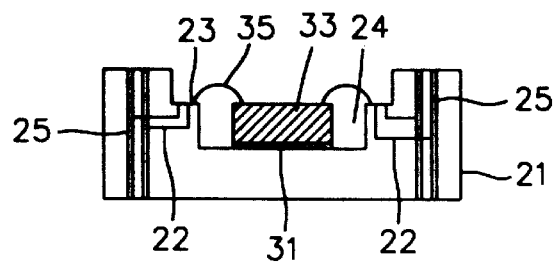

As shown in FIG. 4B, a wire bonding process is performed in such a manner that a semiconductor chip 33 is attached to the bottom of the cavity 24 using an adhesive member 31, and the semiconductor chip 33 and the conductive wires 22 are connected by the conductive wires 35.

Figure 4C:
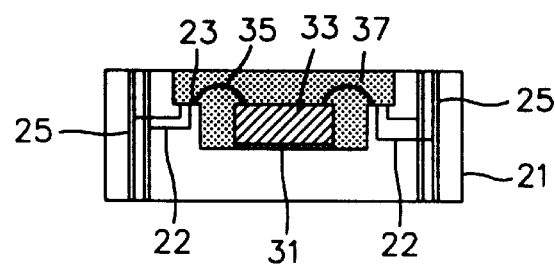

Next, as shown in FIG. 4C, a molding process is performed in such a manner that a molding compound is filled into the cavity 24, and then the semiconductor chip 33 and the wires 35 are molded.

Figure 4D:
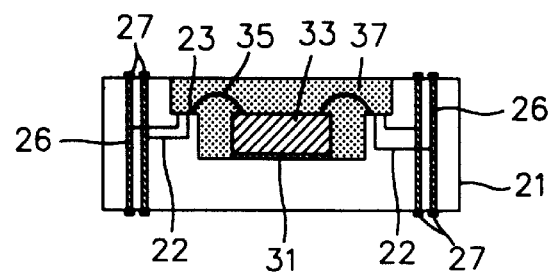

In addition, as shown in FIG. 4D, a metallic material filling process during which a conductive metallic material 26 such as a solder bar is filled into each via hole 25 may be performed, and a process during which conductive external terminals 27 such as solder balls may be attached to the upper and lower surfaces of the substrate main body 21, so that both ends each of the conductive metallic material 26 are electrically connected. The metallic filling process is classified into a process for filling a solder bar into the via holes 25 and a process for reflowing and hardening the solder bar.

Figure 5A:
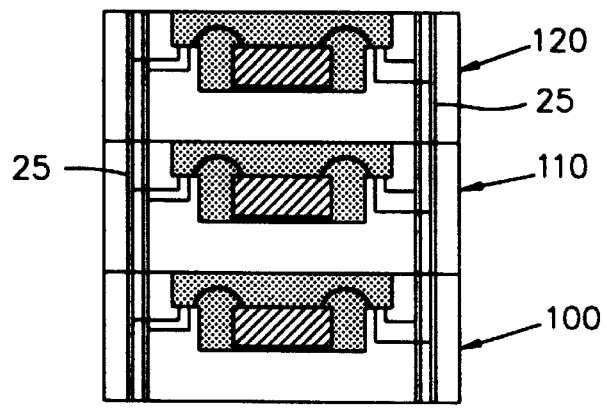
FIGS. 5A through 5C are cross-sectional views illustrating a fabrication method of a stacked semiconductor package module according to the present invention.
Figure 5B:
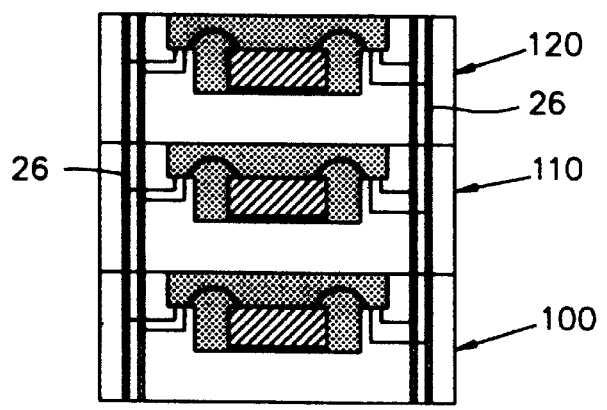
Figure 5C:
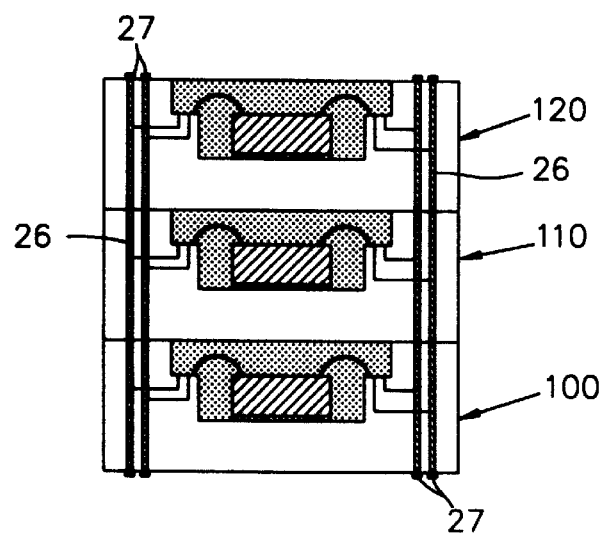

FIGS. 5A through 5C are cross-sectional views illustrating a fabrication method of a stackable semiconductor package module according to the present invention.

As shown in FIG. 5A, the stackable semiconductor packages 100, 110 and 120 shown in FIG. 4C are stacked in multiple tiers. During the stacking process, the stackable semiconductor packages 100, 110, and 120 are accurately aligned and stacked. Additionally, and simultaneously, the via holes 25 formed in the stackable semiconductor packages 100, 110, and 120 are aligned.

As shown in FIG. 5B, in a metallic material filling process, a conductive metallic material 26 is filled into the thusly aligned via holes 25. The metallic material filling process is classified into a process during which a solder bar is filled into the aligned via holes 25, respectively, and a process during which the solder bar is re-flown and hardened.

As shown in FIG. 5C, the conductive external terminals 27 are attached on the upper surface of the uppermost layer of the semiconductor package 120 and the lower surface of the lowermost layer of the semiconductor package 100, respectively, so that both ends of each of the conductive metallic material 27 are electrically connected, thus fabricating a stackable semiconductor package module according to the present invention.

As described above, in the present invention, it is possible to fabricate a stackable semiconductor package by packaging a semiconductor chip using a semiconductor substrate. In addition, it is possible to fabricate a high-integrated semiconductor package module in a limited area using a stackable semiconductor package according to the present invention. Furthermore, it is possible to accurately align and stack each package using the via holes formed in the stackable packages, and the semiconductor chips of each package are electrically connected by a conductive metallic material (solder bar) filled into the via holes.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

The foregoing description and the drawings are regarded as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer or alternative inventive concepts that are included in the contents of the application and could be defined by claims differing in scope from the following claims, which different claims may be adopted subsequently during prosecution, for example, for the purposes of a continuation or divisional application.

What is claimed is:

1. A stackable semiconductor package fabrication method comprising:
   preparing a non-conductive substrate main body having a plurality of patterned conductive wires therein and a cavity in an upper center portion of the substrate main body;

forming a step portion on a lateral wall of the cavity;

forming a plurality of via holes, the via holes perpendicularly passing through at least one of the edge portions of the substrate main body;

attaching a semiconductor chip on a lower surface of the cavity;

electrically bonding the semiconductor chip to the patterned conductive wires using second conductive wires; and filling a molding compound into the cavity and molding the semiconductor chip and the second conductive wires, a first end of each of the patterned conductive wires being exposed on an upper surface of the step portion and a second end of each of the patterned conductive wires being coupled with one of the plurality of via holes, the stackable semiconductor package fabrication method further comprising the step of placing a conductive metallic material in each via hole, the step of placing a conductive metallic material in each via hole comprising
placing a solder bar into the via holes, and
reflowing and hardening the solder bars.

2. A stacked semiconductor package module fabrication method, comprising:

preparing at least two stackable semiconductor packages, the process for preparing each stackable semiconductor package comprising:

preparing a non-conductive substrate main body having a plurality of patterned conductive wires formed therein, a cavity having a step portion being formed on an upper center portion of the substrate main body, forming a plurality of via holes perpendicularly passing through the substrate main body near the cavity, attaching a semiconductor chip to a lower surface of the cavity, and electrically coupling the semiconductor chip and the patterned conductive wires and filling the cavity with a molding compound;

aligning the via holes formed in the stackable semiconductor packages and stacking the stackable semiconductor packages;

placing a solder bar in the aligned via holes;

reflowing and hardening the solder bar; and attaching conductive external terminals to an upper surface of an uppermost of the stackable semiconductor packages and a lower surface of a lowermost of the stackable semiconductor packages, the conductive external terminals being electrically connected with the conductive metallic material.

* * * * *